(12) United States Patent
Berk et al.

(10) Patent No.: US 12,308,613 B2
(45) Date of Patent: May 20, 2025

(54) VERTICAL-CAVITY SURFACE-EMITTING LASER (VCSEL) WITH CASCADED ACTIVE REGION

(71) Applicant: Mellanox Technologies, Ltd., Yokneam (IL)

(72) Inventors: Yuri Berk, Kiryat Tivon (IL); Vladimir Iakovlev, Ecublens (CH); Tamir Sharkaz, Kfar Tavor (IL); Elad Mentovich, Tel Aviv (IL)

(73) Assignee: Mellanox Technologies, Ltd., Yokneam (IL)

( * ) Notice: Subject to any disclaimer, the term of this patent is extended or adjusted under 35 U.S.C. 154(b) by 0 days.

(21) Appl. No.: 18/211,710

(22) Filed: Jun. 20, 2023

(65) Prior Publication Data

US 2024/0136795 A1 Apr. 25, 2024
US 2024/0235160 A9 Jul. 11, 2024

Related U.S. Application Data

(63) Continuation of application No. 17/247,401, filed on Dec. 10, 2020, now Pat. No. 11,728,623.
(Continued)

(51) Int. Cl.
*H01S 5/30* (2006.01)
*H01S 5/024* (2006.01)
(Continued)

(52) U.S. Cl.
CPC ...... *H01S 5/18347* (2013.01); *H01S 5/02461* (2013.01); *H01S 5/18311* (2013.01);
(Continued)

(58) Field of Classification Search
CPC ............. H01S 5/18347; H01S 5/02461; H01S 5/18311; H01S 5/18377; H01S 5/2275; H01S 5/3095; H01S 5/3401; H01S 5/423
See application file for complete search history.

(56) References Cited

U.S. PATENT DOCUMENTS 5,729,563 A * 3/1998 Wang ...................... H01S 5/423
372/50.23
2002/0186726 A1 12/2002 Ledentsov et al.
(Continued)

OTHER PUBLICATIONS

Paschotta, Dr. R. "VCSEL Arrays", [retrieved from Internet], <URL:https://www.rp-photonics.com/vcsel_arrays.html>, (undated).
(Continued)

*Primary Examiner* — Yuanda Zhang
(74) *Attorney, Agent, or Firm* — R. W. McCord Rayburn; Moore & Van Allen PLLC

(57) ABSTRACT

A vertical-cavity surface-emitting laser (VCSEL) is provided that includes a mesa structure disposed on a substrate. The mesa structure defines an emission axis of the VCSEL. The mesa structure includes a first reflector, a second reflector, and a cascaded active region structure disposed between the first reflector and the second reflector. The cascaded active region structure includes a plurality of cascaded active region layers disposed along the emission axis, where each of the cascade active region layers includes an active region having multi-quantum well and/or dots layers (MQLs), a tunnel junction aligned with the emission axis, and an oxide confinement layer. The oxide confinement layer is disposed between the tunnel junction and MQLs, and has an electrical current aperture defined therein. The mesa structure defines an optical window through which the VCSEL is configured to emit light.

20 Claims, 8 Drawing Sheets

Related U.S. Application Data

(60) Provisional application No. 62/947,636, filed on Dec. 13, 2019.

(51) Int. Cl.
   *H01S 5/183* (2006.01)
   *H01S 5/227* (2006.01)
   *H01S 5/34* (2006.01)
   *H01S 5/42* (2006.01)

(52) U.S. Cl.
   CPC ........ *H01S 5/18377* (2013.01); *H01S 5/2275* (2013.01); *H01S 5/3095* (2013.01); *H01S 5/3401* (2013.01); *H01S 5/423* (2013.01)

(56) References Cited

U.S. PATENT DOCUMENTS

| | | |
|---|---|---|
| 2004/0096996 A1 | 5/2004 | Cheng et al. |
| 2017/0256915 A1 | 9/2017 | Ghosh et al. |
| 2020/0112140 A1* | 4/2020 | Jayaraman .............. H01S 5/042 |
| 2020/0321755 A1 | 10/2020 | Wang et al. |
| 2020/0335942 A1 | 10/2020 | Carson et al. |

OTHER PUBLICATIONS

McInerney, John et al., "Novel 980-nm and 490-nm light sources using vertical-cavity lasers with extended coupled cavities". [retrieved from Internet], <URL:https://www.SPIEDigitalLibrary.org/conference proceedings-of-spie>, dated (Jun. 17, 2003).

Ki Wook Jung et al., "Microchannel Cooling Strategies for High Heat Flux (1kW/cm2) Power Electronic Applications", Mechanical Engineering Department, Stanford University, dated (2017).

Knodl, Thomas et al., "Bipolar Cascade VCSEL With 130% Differential Quantum Efficiency", [retrieved from Internet], <URL:https://www.uni-ulm.de/fileadmin/website_uni_ulm/iui.inst.140/Jahresbericht/2000/ar2000_tk.pdf>, dated (2000).

Knodl, Thomas et al., "Multistage bipolar cascade vertical-cavity surface-emitting lasers: theory and experiment", IEEE Journal of Selected Topics in Quantum Electronics, vol. 9, No. 5, dated (Sep./Oct. 2003).

\* cited by examiner

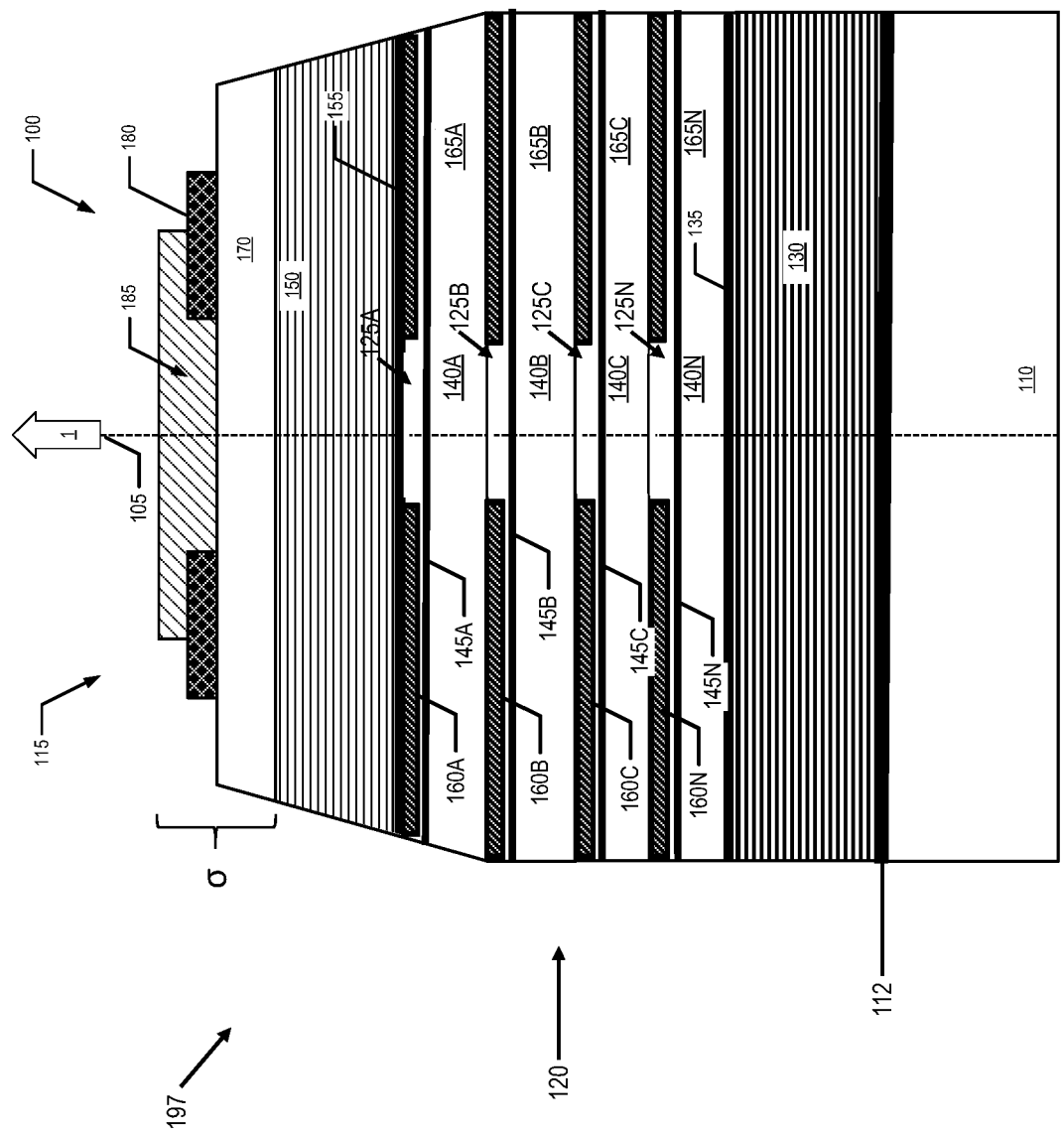

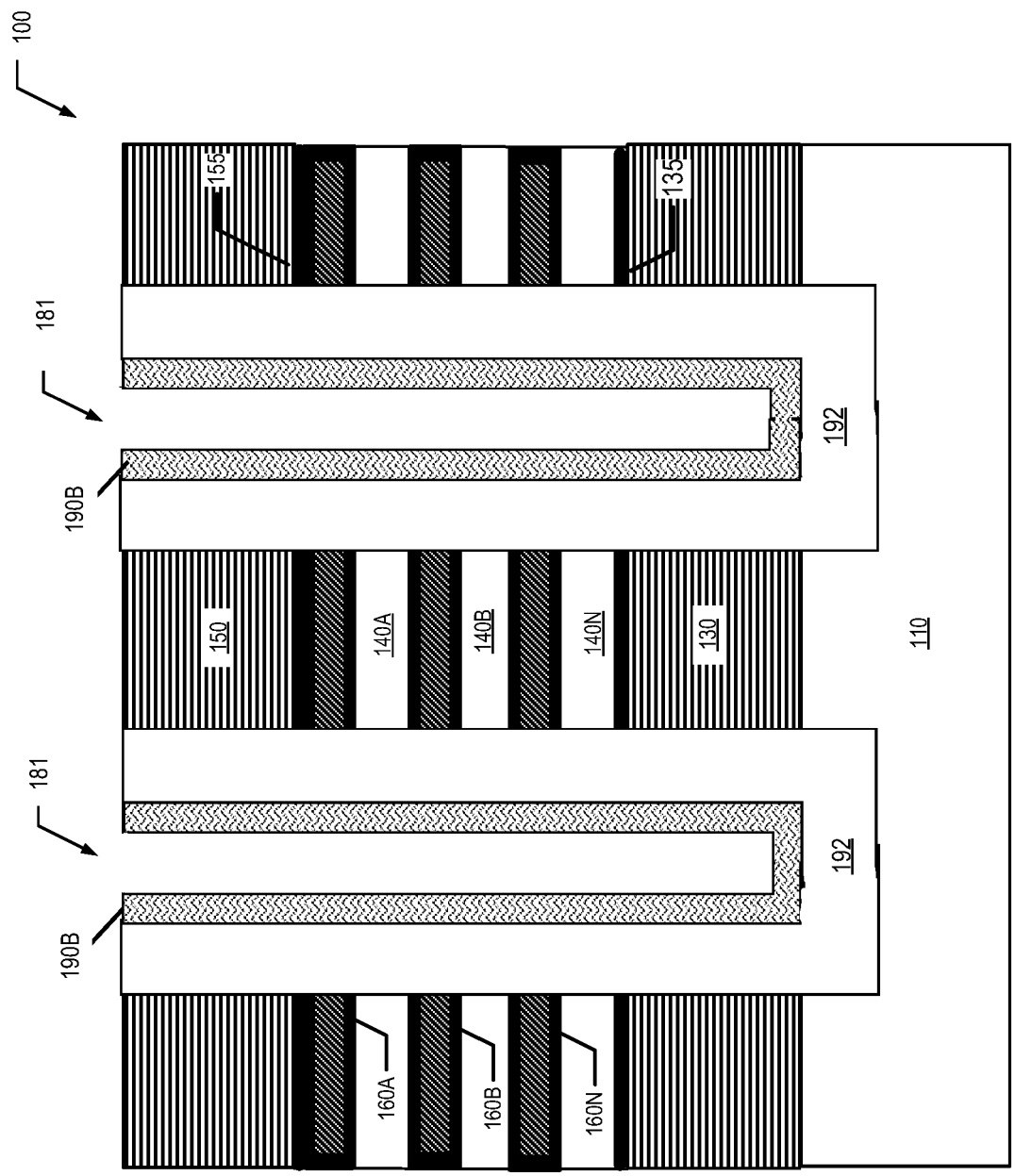

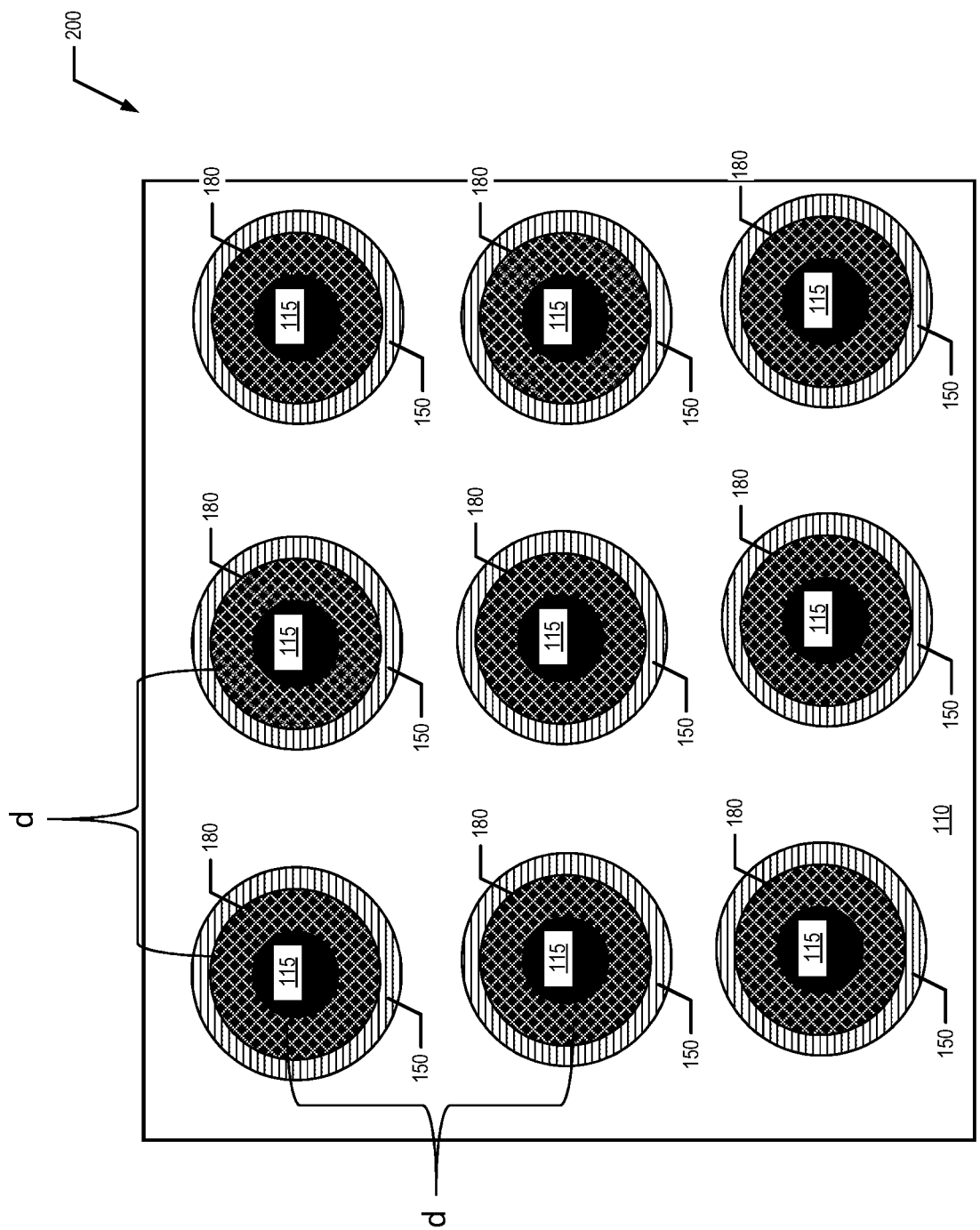

VERTICAL-CAVITY SURFACE-EMITTING LASER (VCSEL) WITH CASCADED ACTIVE REGION

CROSS-REFERENCE TO RELATED APPLICATIONS

This application claims priority to U.S. patent application Ser. No. 17/247,401 for a "Vertical-Cavity Surface Emitting Laser (VCSEL) with Cascaded Active Region" filed Dec. 10, 2020 (and published Jun. 17, 2021 as U.S. Patent Application Publication No. 2021/0184432), now U.S. Pat. No. 11,728,623, which claims priority to U.S. Patent Application No. 62/947,636 for "VCSEL Arrays with Vertical Cascading of P-N Diodes Gain Media" filed Dec. 13, 2019. Each of the foregoing patent applications, publication, and patent is incorporated herein by reference in its entirety.

FIELD

Embodiments of the present invention relate generally to vertical-cavity surface-emitting lasers (VCSELs). Example embodiments relate generally to high speed, high bandwidth VCSELs with cascaded active regions.

BACKGROUND

As data communication demands increase in both volume and speed, fiber optics have become an increasingly popular communication approach. One emerging element of this approach for generating the data stream communicated through fiber optics cables comprises a VCSEL with scaled power output. However, traditional VCSEL designs for scaling power output tend to require high current densities, thereby decreasing the lifetime of the VCSEL.

BRIEF SUMMARY OF SOME EXAMPLE EMBODIMENTS

Various embodiments provide VCSELs, VCSEL arrays, and/or corresponding methods of manufacturing. In various embodiments, the VCSELs comprise a cascaded active region structure sandwiched between first and second reflectors. Various embodiments further comprise heat dissipation structures configured to absorb and/or dissipate heat generated through operation of the VCSEL(s).

In an example embodiment, a vertical-cavity surface-emitting laser (VCSEL) is provided that comprises a mesa structure defining an emission axis of the VCSEL. The mesa structure comprises a first reflector, a second reflector, and a cascaded active region structure disposed between the first reflector and the second reflector. The cascaded active region structure comprises a plurality of cascaded active region layers disposed along the emission axis. Each of the cascaded active region layers comprises an active region, a tunnel junction aligned with the emission axis, and an oxide confinement layer. The VCSEL comprises a heat dissipation structure extending between the first reflector and the second reflector.

In an example embodiment, the heat dissipation structure comprises at least one of an oxide surface and a dielectric surface. In an example embodiment, the at least one of the oxide surface and the dielectric surface contacts a lateral trench surface in the cascaded active region structure and a bottom trench surface in the cascaded active region structure. In an example embodiment, the heat dissipation structure comprises a metal film in contact with the at least one of the oxide surface and the dielectric surface.

In an example embodiment, each of the plurality of cascaded active region layers is connected in sequence with another of the plurality of cascaded active region layers.

In an example embodiment, the VCSEL comprises a substrate on which the mesa structure is disposed, where the heat dissipation structure extends through the first reflector and between the substrate and the second reflector.

In an example embodiment, the VCSEL comprises a first current spreading layer disposed between the first reflector and the cascaded active region structure and a first contact in electrical communication with the first current spreading layer. In an example embodiment, the VCSEL comprises a second current spreading layer disposed between the cascaded active region structure and the second reflector and a second contact in electrical communication with the second current spreading layer. In an example embodiment, the first current spreading layer and the second current spreading layer are configured to provide electrical signals applied to the first contact and the second contact, respectively, to each active region of the cascaded active region structure.

In an example embodiment, a vertical-cavity surface-emitting laser (VCSEL) is provided that comprises a substrate and a mesa structure disposed on the substrate. The mesa structure defines an emission axis of the VCSEL and comprises a first reflector, a second reflector, and a cascaded active region structure disposed between the first reflector and the second reflector. The cascaded active region structure comprises a plurality of cascaded active region layers disposed along the emission axis, where each of the cascaded active region layers comprises an active region, a tunnel junction aligned with the emission axis, and an oxide confinement layer. The VCSEL comprises a heat dissipation structure extending between the substrate and the second reflector.

In an example embodiment, the heat dissipation structure extends into the substrate.

In an example embodiment, the heat dissipation structure comprises at least one of an oxide surface and a dielectric surface. In an example embodiment, the at least one of the oxide surface and the dielectric surface contacts a lateral trench surface in the cascaded active region structure and a bottom trench surface in the cascaded active region structure. In an example embodiment, the at least one of the oxide surface and the dielectric surface contacts a lateral trench surface in the first reflector and a bottom trench surface in the first reflector. In an example embodiment, the at least one of the oxide surface and the dielectric surface contacts a lateral trench surface in the second reflector. In an example embodiment, the heat dissipation structure comprises a metal film in contact with the at least one of the oxide surface and the dielectric surface.

In an example embodiment, a vertical-cavity surface-emitting laser (VCSEL) is provided that comprises a substrate and a mesa structure disposed on the substrate. The mesa structure defines an emission axis of the VCSEL and comprises a first reflector, a second reflector, and a cascaded active region structure disposed between the first reflector and the second reflector. The cascaded active region structure comprises a plurality of cascaded active region layers disposed along the emission axis, where each of the cascaded active region layers comprises an active region, a tunnel junction aligned with the emission axis, and an oxide confinement layer. The VCSEL comprises a first heat dissipation structure extending between the first reflector and the second reflector and a second heat dissipation structure extending between the substrate and the second reflector.

In an example embodiment, the first heat dissipation structure comprises at least one of a first oxide surface and a first dielectric surface in contact with a first lateral trench surface in the cascaded active region structure and the second heat dissipation structure comprises at least one of a second oxide surface and a second dielectric surface in contact with a second lateral trench surface in the cascaded active region structure. In an example embodiment, the first heat dissipation structure comprises a first metal film in contact with the at least one of the first oxide surface and the first dielectric surface and the second heat dissipation structure comprises a second metal film in contact with the at least one of the second oxide surface and the second dielectric surface.

In an example embodiment, the second heat dissipation structure is substantially u-shaped and comprises a planar base and two vertical legs.

BRIEF DESCRIPTION OF THE DRAWING(S)

Having thus described the invention in general terms, reference will now be made to the accompanying drawings, which are not necessarily drawn to scale, and wherein:

FIG. 1A illustrates a schematic cross-section of a VCSEL having a cascaded active region structure, according to an example embodiment;

FIG. 3A illustrates a schematic cross-section of a VCSEL having a cascaded active region structure and a second heat dissipation structure, according to an example embodiment;

FIG. 4 illustrates a schematic top view of a VCSEL array, according to an example embodiment.

DETAILED DESCRIPTION OF SOME EXAMPLE EMBODIMENTS

Figure 1B:
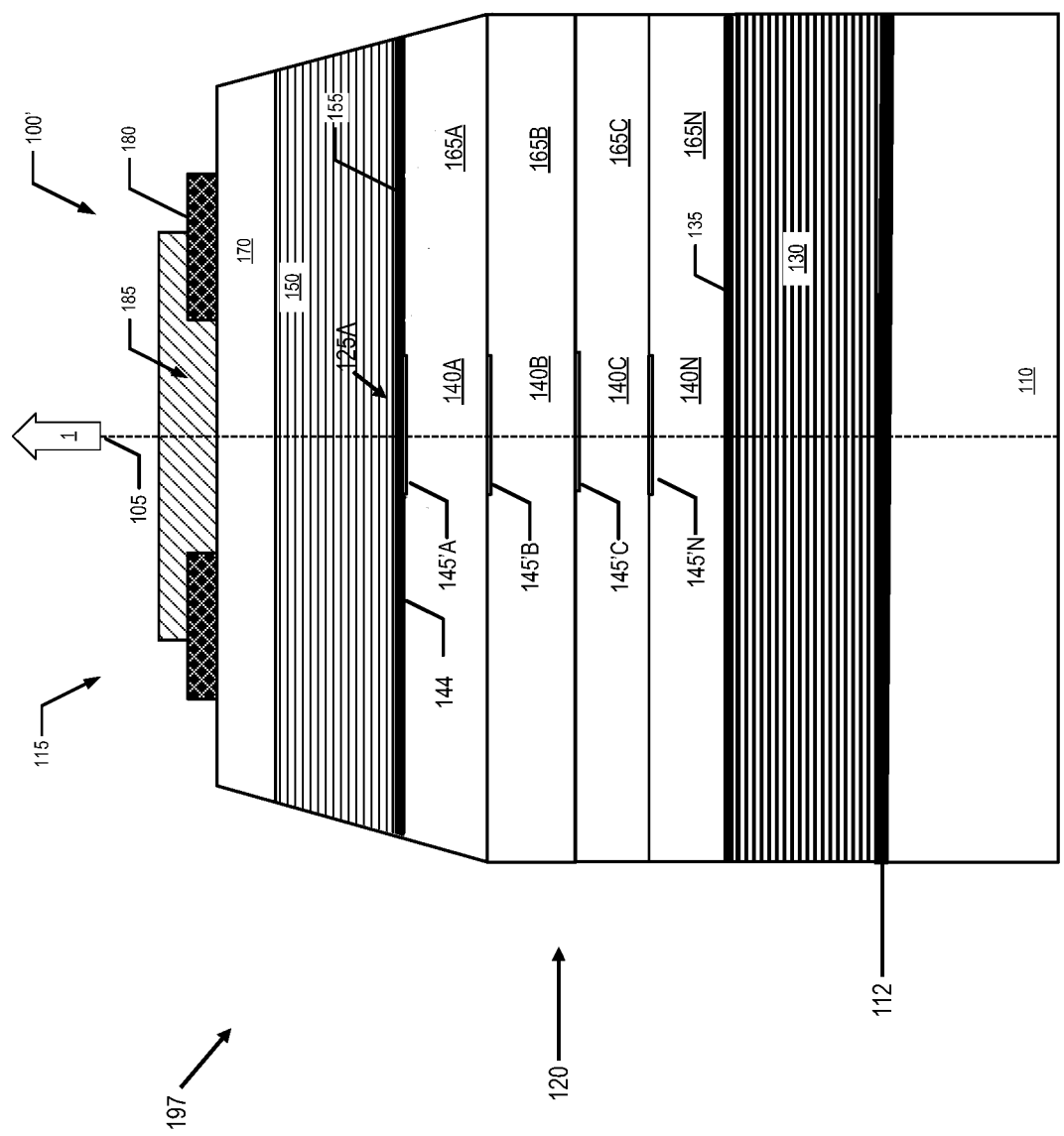
FIG. 1B illustrates a schematic cross-section of a VCSEL having a cascaded active region structure, according to another example embodiment.

The present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout. As used herein, terms such as "top," "bottom," "front," etc. are used for explanatory purposes in the examples provided below to describe the relative position of certain components or portions of components. Accordingly, as an example, the term "top current spreading layer" may be used to describe a current spreading layer; however, the current spreading layer may be on the "top" or on the "bottom," depending on the orientation of the particular item being described. As used herein, the terms "substantially" and/or "approximately" refers to tolerances within manufacturing and/or engineering standards.

Exemplary VCSEL

FIG. 1A illustrates a cross section view of a portion of an example embodiment of vertical-cavity surface-emitting laser (VCSEL) 100. The VCSEL 100 comprises a substrate 110 and an emission structure 197. In an example embodiment, a thin buffer layer 112 (e.g., an approximately 0.5 to 1.5 μm thick n-type layer) may be deposited and/or disposed between the substrate 110 and the emission structure 197. In an example embodiment, the emission structure 197 comprises a first reflector 130, a second reflector 150, and a cascaded active region structure 120 sandwiched between the first reflector 130 and the second reflector 150. In an example embodiment, the first reflector 130 is deposited and/or disposed directly on the substrate 110 and/or the thin buffer layer. In an example embodiment, the emission structure 197 forms and/or is part of a mesa structure 115.

In an example embodiment, the cascaded active region structure 120 comprises a plurality of cascaded active region layers 165A-165N. In an example embodiment, each of the plurality of cascaded active region layers 165A-165N comprises a corresponding active region 140 (e.g., 140A, 140B, etc.) and a tunnel junction 145 (e.g., 145A, 145B, etc.). For example, the cascaded active region structure 120 may comprise a first cascaded active region layer 165A having a first active region 140A, and a second cascaded active region layer 165B having a second active region 140B. In an example embodiment, each active region 140A-140N is identical. Alternatively, in some embodiments, one or more active regions (e.g., 140A, 140B, etc.) may differ. For example, the first active region 140A and the second active region 140B may differ, including, but not limited to, having different material compositions, different band structures in one or more layers or stacks of the active region, and/or different doping.

In an example embodiment, each cascaded active region layer 165A-165N is connected to an adjacent cascaded active region layer via a corresponding tunnel junction 145. For example, a first cascaded active region layer (e.g., cascaded active region layer 165A) may be connected to a second cascaded active region layer (e.g., cascaded active region layer 165B) via the tunnel junction of the first cascaded active region layer (e.g., tunnel junction 145A). In an example embodiment, each cascaded active region layer is connected in sequence, via a respective tunnel junction 145, with one or two adjacent cascaded active region layers. For example, a current or electric field line flowing through the cascaded active region structure 120 may flow through first cascaded active region layer 165A into second cascaded active region layer 165B via the tunnel junction 145A of the first cascaded active region layer. Similarly, light generated in the active region 140A of the first cascaded active region layer 165A may pass into the second cascaded active region layer 165B via the tunnel junction 145A of the first cascaded active region layer.

In an example embodiment, each of the cascaded active region layers further comprises an oxide confinement layer 160. In an example embodiment, the oxide confinement layer 160 is deposited and/or disposed directly on or adjacent to the active region 140 and has an aperture, such as an aperture 125, shown in FIG. 1A, defined therein. In an example embodiment, the aperture defined in the oxide confinement layer 160 comprises AlGaAs or another suitable material. In an example embodiment, the oxide confinement layer 160 is configured to achieve electrical confinement in a direction lateral to an emission axis 105 defined by the mesa structure 115 of the VCSEL 100. That is, the oxide confinement layer 160 of an example embodiment may be configured to control current flow in a direction substantially perpendicular and/or non-parallel to the emission axis 105. For example, the oxide confinement layer 160 may cause the current flow in the cascaded active region structure 120 to pass between cascaded active region layers via tunnel junctions 145. The tunnel junction 145 of an example embodiment is configured to achieve at least one of electrical confinement or optical confinement in a direction substantially parallel to the emission axis 105. In some embodiments, the tunnel junction 145 is disposed in the aperture 125 defined in the oxide confinement layer 160. For example, the tunnel junction 145 may be overgrown in a portion of the second surface 144 of the active region 140 corresponding to the aperture 125 in the oxide confinement layer 160.

In an example embodiment, an operation voltage for operating the VCSEL 100 is determined at least in part by the number of cascaded active region layers 165A-165N comprising the cascaded active region structure 120. In an example embodiment, an operating mode of the VCSEL 100 may be determined by the number of cascaded active region layers 165A-165N comprising the cascaded active region structure 120. For example, a VCSEL that is designed to operate in a pulsed mode may comprise a greater number of cascaded active region layers than a VCSEL that is designed to operate in a continuous mode. In various embodiments, the number of cascaded active region layers 165A-165N comprising the cascaded active region structure 120 is determined based on voltage constraints, operating constraints, output constraints, and/or the like of the corresponding application.

In an example embodiment, the VCSEL 100 further comprises contacts (e.g., comprising trace(s) and/or pad(s) for connecting an electrical source to the VCSEL 100) that are electrically connected to the emission structure 197 (e.g., via the first and second current-spreading layers 135, 155). For example, the VCSEL 100 may comprise a second contact 180 disposed adjacent to, mounted to, secured to, and/or abutting the cap layer 170 and extending away from the emission structure 197 to provide trace(s) and pad(s) for connecting an electrical source to the VCSEL 100. In an example embodiment, the second contact 180 is in electrical communication with the second current-spreading layer 155 and a first contact (e.g., disposed adjacent to the mesa structure 115, in another mesa structure, and/or the like) is in electrical communication with the first current-spreading layer 135. For example, the first and second contacts 180 may comprise an anode contact and a cathode contact. In various embodiments, the contacts 180 are configured to have leads secured thereto such that the VCSEL 100 may be operated by applying voltage, current, an electrical signal and/or the like to the VCSEL 100 via the leads. In various embodiments, the first and second current-spreading layers 135, 155 are configured to provide electrical signals, current, voltage, and/or the like applied to the contacts 180 to the cascaded active region structure 120. In various embodiments, the first and/or second contacts 180 may be made of gold or another conductive material. In an example embodiment, the second contact 180 defines an optical window 185 through which the VCSEL 100 is configured to emit laser light 1.

In an example embodiment, the substrate 110 provides a base layer upon which the VCSEL is built, mounted, secured, and/or the like. In an example embodiment, the substrate 110 is a semi-insulating gallium arsenide (GaAs) substrate. In various embodiments, the substrate 110 is a GaAs substrate doped with silicon (Si) or various other elements. In another example embodiment, the substrate 110 is a Si substrate, or another appropriate substrate. In an example embodiment, the substrate 110 may be in the range of 50 to 300 μm thick. For example, the substrate 110 may be approximately 150 μm thick, in an example embodiment. In an example embodiment, the substrate 110 is at least a portion of a wafer.

In various embodiments, the emission structure of the VCSEL 100 comprises a first reflector 130, a first current-spreading layer 135, a cascaded active region structure 120, a second current-spreading layer 155, and a second reflector 150. The first reflector 130 may be adjacent, secured, mounted to and/or abutting the substrate 110 and/or the thin buffer layer. The first current-spreading layer 135 may be a current spreading and/or conductive layer sandwiched between the first reflector 130 and the cascaded active region structure. For example, as depicted in the embodiments of FIGS. 1-4, the first current-spreading layer 135 may be adjacent, secured, mounted to and/or abutting the first reflector 130 and a first active region 140 of a first cascaded active region layer of the plurality of cascaded active region layers comprising the cascaded active region structure. Likewise, the second current-spreading layer 155 may be a current spreading and/or conductive layer sandwiched between the cascaded active region structure and the second reflector 150. For example, the second current-spreading layer 155 may be adjacent, secured, mounted to and/or abutting the cascaded active region structure and the second reflector 150.

In various embodiments, the first reflector 130 and the second reflector 150 are configured to couple and/or reflect laser light generated by the cascaded active region structure (i.e., light generated by each active region 140 of the cascaded active region structure) such that the laser light 1 may be emitted through the aperture of aperture diameter $a_c$ in the contact 180 in a direction along the emission axis 105. In various embodiments, the first reflector 130 and the second reflector 150 each comprises a semiconductor Distributed Bragg reflector (DBR), dielectric reflector stacks, and/or the like. For example, the first reflector 130 and the second reflector 150 may comprise un-doped alternating layers of aluminum gallium arsenide (AlGaAs) and gallium arsenide (GaAs). In various embodiments, each of the first and second reflectors 130, 150 may comprise a plurality of layers of AlGaAs and GaAs. For example, each of the first and second reflectors 130, 150 may comprise between 15 and 35 pairs of layers of GaAs/AlGaAs. For example, in some embodiments, each of the first and second reflectors may comprise 25 pairs of layers of GaAs/AlGaAs. For example, each of the first and second reflectors may comprise 25 layers of GaAs and 25 layers of AlGaAs disposed such that the layers alternate between a GaAs layer and an AlGaAs. For example, a pair of layers may consist of a GaAs layer and an abutting AlGaAs layer.

In an example embodiment, the thickness of each layer is approximately one-fourth $\lambda/n$, where $\lambda$ is the emission wavelength and n is the refractive index of the semiconductor of that layer. In an example embodiment, at least one layer of the first reflector 130 is doped such that the first reflector comprises an n-type DBR (N-DBR). In an example embodiment, at least one layer of the second reflector 150 is doped such that the second reflector comprises a p-type DBR (P-DBR).

As described above, a first current-spreading layer 135 may be sandwiched between the first reflector 130 and the cascaded active region structure, and a second current-spreading layer 155 may be sandwiched between the cascaded active region structure and the second reflector 150. In various embodiments, the first and second current-spreading layers 135, 155 comprise n-type indium phosphide (n-InP) layers. In various embodiments, the first and/or second current-spreading layer 135, 155 comprises an indium gallium arsenide phosphide (InGaAsP) layer. In various embodiments, providing the electrical contact through n-type first and second current-spreading layers 135, 155 allows for each of the first and second reflectors 135, 155 to comprise un-doped DBR mirrors or dielectric reflector stacks, as described elsewhere herein.

In an example embodiment, a tunnel junction 145 is a mesa etched in the $p^{++}/n^{++}$ tunnel junction. In an example embodiment, each tunnel junction 145 comprises a heavily doped p++/n++ indium aluminum gallium arsenide tunnel junction. In various embodiments, a reverse biased p-n junction blocks the current around each tunnel junction 145 when a direct voltage is applied to the VCSEL 100 (e.g., via the contacts 180). As shown in FIG. 1B, in various embodiments, a VCSEL 100' comprises a tunnel junction that is a buried tunnel junction 145' (e.g., 145'A, 145'B, 145'C, 145'N). In an example embodiment, the VCSEL 100' comprises a plurality of buried tunnel junctions 145' (one per cascaded active region layer 165) which provides both current and photon confinement such that the oxide barrier layer 160 is not required between each pair of cascaded active region layers 165. A buried tunnel junction is a tunnel junction that is formed and/or regrown within a semiconductor layer and does not extend across the entire mesa 115. For example, the buried tunnel junction may be a "mesa within a mesa." In various embodiments, the tunnel junctions 145 serve a dual role of optical (photon) and electrical (current) confinement. Each of the buried tunnel junctions 145' may, for example, be embedded in a respective overgrown region that provides both current and photon confinement. In this example, the current is confined by the reverse p-n junction that is formed at the interface between the second current-spreading layer 155 and a p-layer comprising a second surface 144 of the final active region 140 (e.g., the active region closest to the second reflector 150). In an example embodiment, optical confinement is defined by the tunnel junctions 145 representing an optical aperture for emitting laser light 1 and is determined by the width or diameter of the tunnel junctions 145' (e.g., the tunnel junction diameter $D_{TJ}$) and/or the optical aperture in the oxide confinement layer 160 in a plane perpendicular to the emission axis 105. In an example embodiment, the optical aperture for emitting laser light 1 is determined by the width or diameter of the buried tunnel junction 145' closest to the second reflector 150.

In various embodiments, the cascaded active region structure is sandwiched and/or disposed between the first and second current-spreading layers 135, 155. In various embodiments, the cascaded active region structure is in electrical communication with the first and second current-spreading layers 135, 155. In various embodiments, each active region 140 of the cascaded active region structure comprises a plurality of MQLs, where light and/or electromagnetic radiation 1 is generated, between the first and second reflectors 130, 150. In various embodiments, each active region 140 may comprise a MQL of VCSEL gain media stack, and a p-type region (layer) disposed between the second current-spreading layer 155 and the MQL stack. For example, a second surface 144 of the active region 140 may comprise a p-type layer. In an example embodiment, MQL of each active region 140 may comprise six un-doped, compressively strained, indium aluminum gallium arsenide (InAlGaAs) quantum wells and seven tensile strained InAlGaAs barriers. In various alternative embodiments, each active region 140 may comprise differing numbers of quantum wells and barriers. Thus, for example, each active region 140 may comprise differing numbers of un-doped, compressively strained, InAlGaAs quantum wells and differing numbers of tensile strained InAlGaAs barriers.

In an example embodiment, a cap layer 170 is deposited and/or disposed on the emission structure. The cap layer 170 of an example embodiment is electrically conductive, and thus is configured to provide a low-resistivity contact. The cap layer 170 of an example embodiment is transparent to light in the operating wavelength of the VCSEL 100. Thus, in an example embodiment, the cap layer 170, together with the second contact 180, further defines the optical window 185. In an example embodiment, the optical window 185 defines an optical thickness a (shown in FIG. 1A). Thus, the optical window 185 of various embodiments is configured to control the photon life-time, as photon-lifetime is dependent on the optical thickness σ.

Exemplary Array of VCSELs Having a Cascaded Active Region Structure and Heat Dissipation Structures In various embodiments, a VCSEL array 200 comprising a plurality of VCSELs 100 may be formed on a substrate 110. For example, as shown in FIG. 4, a plurality of individual VCSELs 100 may be configured into a two-dimensional arrangement on a substrate 110. The particular number of VCSELs 100 comprising the VCSEL array 200 may vary according to the application for which the VCSEL array 200 is intended. In an example embodiment, the VCSEL array 200 comprises a 10×10 arrangement of VCSELs 100. Even further, VCSEL arrays 200 may be scaled into array modules. For example, an array module may comprise one or more VCSEL arrays 200.

In the embodiment depicted in FIG. 4, each VCSEL 100 is disposed an array distance (e.g., an array distance pitch), d, from an adjacent VCSEL 100. As shown, the array distance, d, is defined from a first point on the contact 180 of a first VCSEL 100 to a corresponding first point on the contact 180 of an adjacent VCSEL 100. Although in the depicted embodiment the array distance, d, is constant in both the latitudinal and longitudinal directions, this need not be the case. For example, a latitudinal array distance, $d_1$, may differ from a longitudinal array distance, $d_2$. In such an embodiment, each VCSEL 100 may be disposed nearer to or further from a latitudinally adjacent VCSEL 100 than a longitudinally adjacent VCSEL (and vice-versa). Even still, in various embodiments the array distance, d, may vary in either or both of a latitudinal direction or a longitudinal direction. The array distance, d, may be constrained so that it is greater than the smallest lateral dimension of the VCSEL 100, as defined by a VCSEL dimension element (e.g., the aperture 125). In an example embodiment, the array distance, d, is 40 microns. In an example embodiment, the array distance, d, is 30-50 microns. In an example embodiment, the array distance is 20-60 microns.

Figure 2:
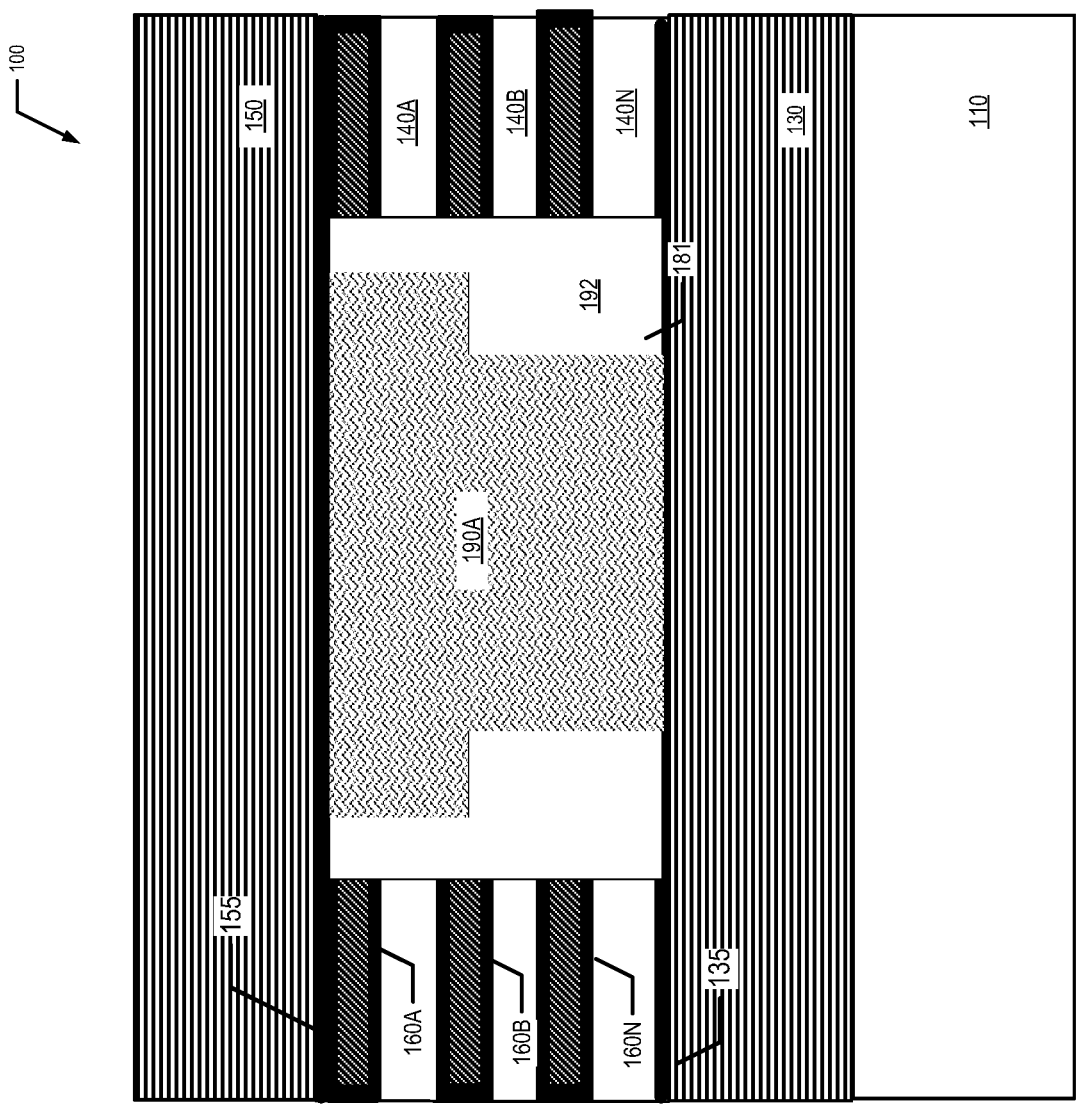
FIG. 2 illustrates a schematic cross-section of a VCSEL having a cascaded active region structure and a first heat dissipation structure, according to an example embodiment.
Figure 3B:
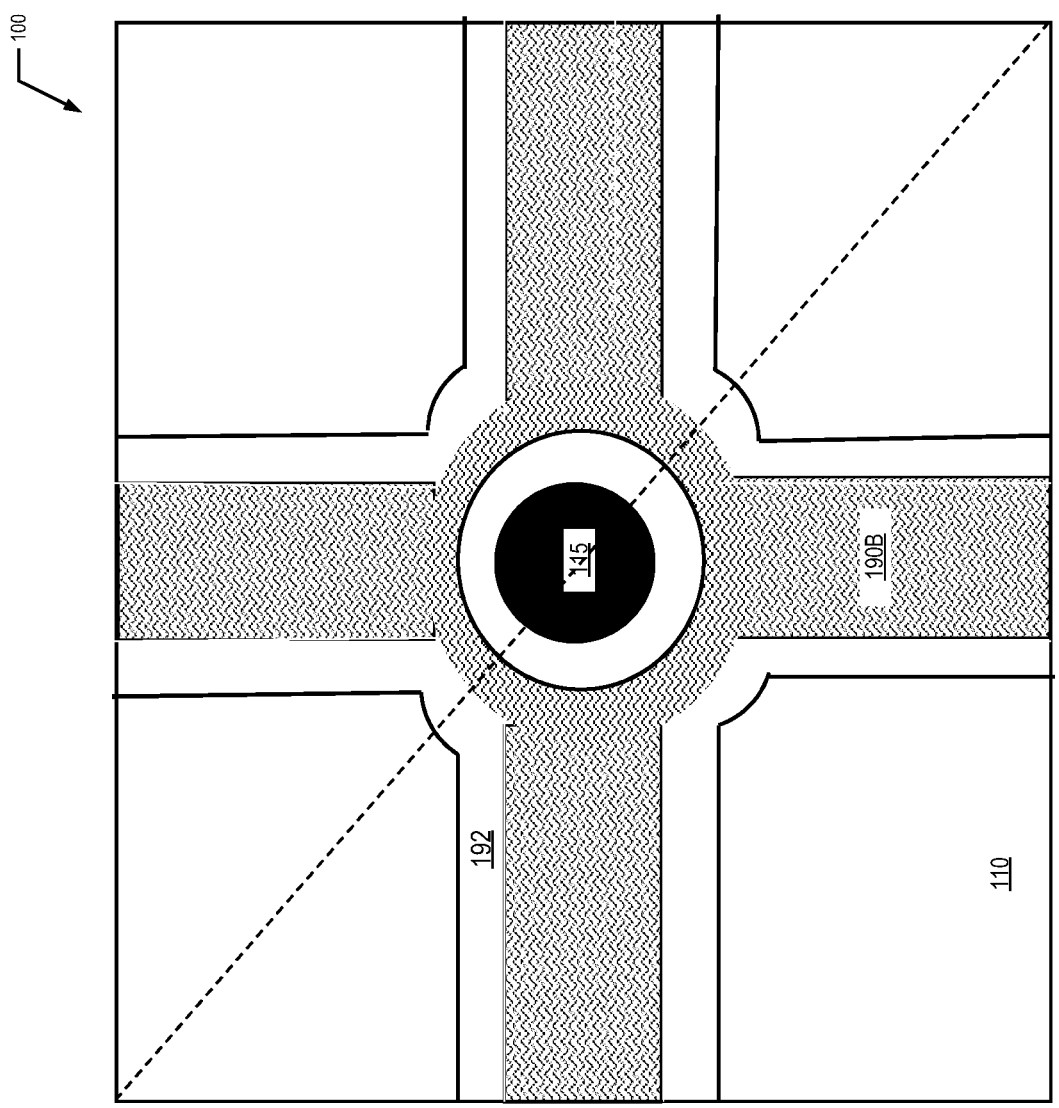
FIG. 3B illustrates a schematic top view of a VCSEL having a cascaded active region structure and a second heat dissipation structure, according to an example embodiment.

During operation of a VCSEL 100, the cascaded active region structure 120 may generate heat. For example, the process of generating light via the cascaded active region structure 120 may generate heat. In various embodiments, a VCSEL array 200 may comprise heat dissipation structures configured to dissipate heat generated during operation of the VCSELs 100 and/or generation of light 1. FIGS. 2, 3A, and 3B illustrate a VCSEL 100 having respective heat dissipation structures 190A and 190B according to embodiments described herein.

As shown in the embodiment of FIG. 2, a first heat dissipation structure 190A may be disposed between the first reflector 130 and the second reflector 150. For example, the first heat dissipation structure 190A may extend between, but not into, either of the first reflector 130 or the second reflector 150. The first heat dissipation structure 190A may comprise: (1) an oxide or dielectric surface 192 in direct contact with lateral and bottom trench surfaces defined in the cascaded active region structure 120 and (2) a metal film in contiguous contact with the oxide or dielectric surface 192. (Fabrication of the above mentioned trench is described below.) Thus configured, the first heat dissipation structure 190A may effectively distribute heat created as a by-product of VCSEL operation and/or light generation.

As shown in the embodiments of FIGS. 3A-3B, a second heat dissipation structure 190B may be disposed between the substrate 110 and the second reflector 150. For example, as shown, the second heat dissipation structure 190B may extend a depth into the substrate 110. Alternatively, the second heat dissipation structure 190B may only extend a depth within the first reflector 130. Similar to the first heat dissipation structure 190A, the second heat dissipation structure 190B may comprise: (1) an oxide or dielectric surface 192 in direct contact with lateral and bottom trench surfaces defined in the first reflector, the cascaded active region structure 120, and/or the second reflector and (2) a metal film in contiguous contact with the oxide or dielectric surface 192. In various embodiments, the second heat dissipation structure 190B may be substantially u-shaped, comprising a planar base and two opposing, vertical legs. Thus configured, the second heat dissipation structure 190B may effectively distribute heat created as a by-product of VCSEL operation and/or light generation.

Exemplary Method of Fabrication of a VCSEL Having a Cascaded Active Region Structure Now, with reference to FIG. 5, a method of fabricating a VCSEL comprising a cascaded active region structure will now be described. In various embodiments, the steps shown in FIG. 5 may be performed in a different order than as shown, as described below, for example, with respect to a second heat dissipation structure 190B. In an example embodiment, a first reflector form is prepared at fabrication step 502. In various embodiments, the first reflector form comprises a first reflector layer formed on a wafer. For example, the first reflector layer (e.g., DBR and/or reflector stacks) is formed on the wafer. In an example embodiment, the wafer is a large wafer and a plurality of VCSELs 100 are to be formed from the first reflector form. In an example embodiment, the first reflector form comprises a wafer (e.g., comprising and/or made of GaAs), a buffer layer (e.g., a GaAs buffer approximately 100 nm thick, and/or the like), and alternating high and low refractive index layers that form a first reflector layer. For example, the first reflector layer may comprise 20-50 alternating high and low refractive index layers. For example, the high refractive index layers may comprise GaAs and the low refractive index layers may comprise $Al_xGa_{(1-x)}As$.

An un-patterned partial epi layer form is prepared at fabrication step 504. The un-patterned partial epi layer form comprises an InP substrate and a plurality of un-patterned epitaxially grown layers. The un-patterned partial epi layer form is referred to herein as a partial epi layer form, because the un-patterned partial epi layer form only comprises the epitaxially grown layers that do not require patterning. For example, additional layers may be grown and/or patterned onto the un-patterned epitaxially grown layers provided by the un-patterned partial epi layer form. In various embodiments, the un-patterned epitaxially grown layers comprise one or more layers of InP and $In_xGa_{(1-x)}As_yP_{(1-y)}$. In an example embodiment, the un-patterned epitaxially grown layers are grown (e.g., epitaxially grown) and/or deposited onto the InP substrate. In an example embodiment, the plurality of un-patterned epitaxially grown layers comprises a fusion layer for bonding to the first reflector layer, a spacer layer, and an N-contact layer. In an example embodiment, the fusion layer and/or the N-contact layer comprises $In_xGa_{(1-x)}As_yP_{(1-y)}$. In an example embodiment, the spacer layer is sandwiched between the fusion layer and the N-contact layer and comprises InP. In an example embodiment, the InP substrate comprises one or more etch stop layers, a buffer, and a substrate body. For example, the one or more etch stop layers may comprise InP and/or $In_xGa_{(1-x)}As_yP_{(1-y)}$. In an example embodiment the buffer comprises InP. In an example embodiment, the substrate body comprises N-type InP.

At fabrication step 506, the partial epi layer form is bonded onto the first reflector form. For example, a first surface of the plurality of un-patterned InP type layers may be bonded to a second surface of the bottom reflector layer. For example, the fusion layer of the plurality of un-patterned epitaxially grown layers may be bonded to a second surface of the bottom reflector layer. In an example embodiment, the first surface of the bottom reflector layer abuts and/or is secured to the wafer and/or buffer layer. As the plurality of un-patterned epitaxially grown layers are not patterned, the alignment between the partial epi layer form and the first reflector form need not be exact or precise and is not affected by shrinking of any of the layers as the resulting bonded blank cools after the bonding is performed. For example, bonding of the un-patterned partial epi layer form to the first reflector form may include heating one or more layers of the partial epi layer form and/or the first reflector form to relatively high temperatures. For example, the bonding process may occur at temperatures greater than 500° C. (e.g., at approximately 600° C., in an example embodiment). In various embodiments, the bonding of the un-patterned partial epi layer form to the first reflector form may include heating at least a portion of the un-patterned partial epi layer form and the first reflector form to a high temperature (e.g., approximately 600° C.) and applying pressure such that mixing occurs on an atomic mono-layer scale between the two adjacent/bonded layers of the un-patterned partial epi layer form and the first reflector form to form the bonded blank. As the layers of the resulting bonded blank cool, the differences in the thermal expansion coefficient between the layers of the first reflector form (e.g., an GaAs-based layer) and the layers of the partial epi layer form (e.g., an InP-based layer) may cause differential shrinking of various layers of the bonded blank. However, as no patterning has yet been performed, the fabrication process is tolerant of the differential shrinking and the differential shrinking does not raise alignment concerns. For example, the bonded blank does not include any substantial variation in any x-y plane. In other words, within any x-y plane, the properties of the bonded blank are approximately and/or substantially constant. In an example embodiment, an x-y plane is normal, orthogonal, and/or perpendicular to the intended emission direction of the VCSEL 100. The intended emission direction of the VCSEL is the direction in which light 1 is emitted from the VCSEL and is generally parallel to the z-direction, as illustrated in FIG. 1.

After the partial epi layer form is bonded onto the first reflector form, the InP substrate may be removed (e.g., via etching). For example, either a wet etching or a dry etching process may be performed (e.g., taking advantage of the one or more etch stop layers of the InP substrate) to remove the InP substrate.

A first regrowth and patterning process is performed at fabrication step 508. For example, a first regrowth process may be performed to grow (e.g., epitaxially grow) first regrowth layers on the un-patterned epitaxially grown layers. A patterning process may then be used to pattern at least a portion of the first regrowth layers to form a tunnel junction pattern. For example, a plurality of active region layers may be grown on the second surface of the plurality of un-patterned epitaxially grown layers, from which the plurality of active regions 140 are formed. In the first regrowth process, for example, each MQL stack of the respective active regions 140 may be grown on the second surface of the plurality of un-patterned InP type layers. For example, the first growth process may include growing a spacer layer, a first barrier, a MQL stack, a second barrier, a P-type InAlAs layer, and/or a P-type InP layer to form an active region 140. In an example embodiment, the spacer layer comprises InP. In an example embodiment, the MQL stack is sandwiched between the first and second buffer layers. In an example embodiment, the first buffer layer, the second buffer layer, and/or the MQL stack comprises $In_xAl_yGa_{(1-x-y)}As$ material layers. As should be understood, the first regrowth process may also refer to multiple iterations of the process just described, so as to grow a plurality cascaded active region layers comprising a plurality of active regions 140.

In various embodiments, a tunnel junction layer may be formed as part of the first regrowth process. In various embodiments, the tunnel junction layer comprises one or more tunnel junction sublayers. For example, the tunnel junction layer may comprise a p++ tunnel junction sublayer and an n++ tunnel junction sublayer. For example, the p++ and/or n++ tunnel junction sublayers may comprise appropriately doped layers of $In_xAl_yGa_{(1-x-y)}As$. The tunnel junction layer may then be patterned to form the tunnel junctions 145 of the VCSELs 100 being formed on the wafer. For example, the tunnel junction layer may be etched (e.g., using a mask and/or the like) to form a plurality of tunnel junctions 145 on the bonded blank. Each tunnel junction 145 corresponds to a VCSEL 100 being formed on the wafer. In various embodiments, the tunnel junction layer is etched to form a plurality of tunnel junctions 145 having a particular diameter (e.g., defined by the VCSEL design). The locations of the tunnel junctions 145 on the bonded blank are precisely and accurately known due to the etching process used to form the tunnel junctions 145. In various embodiments, each iteration of performing a first regrowth process comprises generating a tunnel junction layer and/or buried tunnel junction. For example, each iteration of the first regrowth process may generate a cascaded active region layer 165.

For example, additional active region layers may be formed by repeating the process of growing one or more spacer layer, a first barrier, a MQL stack, a second barrier, a P-type InAlAs layer, and/or a P-type InP, and forming a tunnel junction 145. Thus, the process of growing one or more spacer layer, a first barrier, a MQL stack, a second barrier, a P-type InAlAs layer, and/or a P-type InP and forming a tunnel junction 145 may be repeated until the desired number of active regions 140 and/or cascaded active region layers 165 are formed.

1. Fabrication of First Heat Dissipation Structure

Optional fabrication step 509 includes fabricating one or more heat dissipation structures. In an example embodiment, wherein the VCSEL array 200 comprises first heat dissipation structures 190A, dry etching is used to define a heat dissipation trench 181, as shown in FIG. 2. In an example embodiment, dry etching of the epitaxially grown layers defines a trench therein, within which heat dissipation structure 190A may be formed. In an example embodiment, the trench defines lateral surfaces and a bottom surface (e.g., the first current spreading layer 135 or a top surface of the first reflector 130 may be used as the etch stop layer) that are exposed by the dry etching. In an example embodiment, the lateral surfaces and the bottom surface are oxidized or otherwise covered with an oxide, such as $SiO_2$, or another suitable oxide or dielectric. For example, an oxide layer may be deposited on the exposed surfaces (e.g., including the lateral surfaces and the bottom surface of the trench) and then an etching process may be used to provide an oxide layer that is disposed on the lateral surfaces and the bottom surface of the heat dissipation trench. In an example embodiment, a metal film or layer is deposited in the now oxidized trench such that, during operation of the VCSEL 100, the metal film or layer may act to absorb and dissipate heat away from the cascaded active region layer 120 so as to facilitate dissipation of excess heat generated through operation of the VCSEL 100. In an example embodiment, the metal film or layer may be deposited and/or patterned into a T shaped pattern. In an example embodiment, the metal film or layer may be deposited so as to fill at least a portion of the oxidized trench. In an example embodiment, the metal film or layer is deposited following growth of the cascaded active region structure 120, and before bonding of the second reflector 150 to a top surface of the cascaded active region structure 120. In an example embodiment, the second reflector 150 (described below) is bonded to the VCSEL 100 following deposition of the metal film or layer into the trench. In an example embodiment, a bonding surface of the second reflector 150 that is bonded to the top surface of the cascaded active region structure 120 is conductively bonded to the mesas 115 and is not conductively bonded elsewhere.

A second current spreading layer may be formed at fabrication step 510. For example, the forming of the second current spreading layer at fabrication step 510 may prepare the top surface of the cascaded active region structure 120 for bonding of the second reflector 150 thereto. For example, a second regrowth layer (and/or layer stack) may be grown and/or deposited onto the active region layer and/or onto and/or around the tunnel junctions 145. In an example embodiment, the second regrowth layer (and/or layer stack) comprises elements that will become the second current spreading layer 155 and/or the second contact layer 180 of a VCSEL 100. For example, one or more growth and/or deposition processes may be used to grow and/or deposit the second regrowth layer (and/or layer stack) onto the cascaded active region structure 120 grown and/or patterned previously. For example, the second regrowth layer (and/or layer stack) may include one or more spacer layers and a second contact layer may be grown and/or deposited onto the active region layer and/or junctions 145. For example, the one or more spacer layers may comprise InP. In an example embodiment, the second contact layer comprises $In_xGa_{(1-x)}As_yP_{(1-y)}$.

Figure 5:
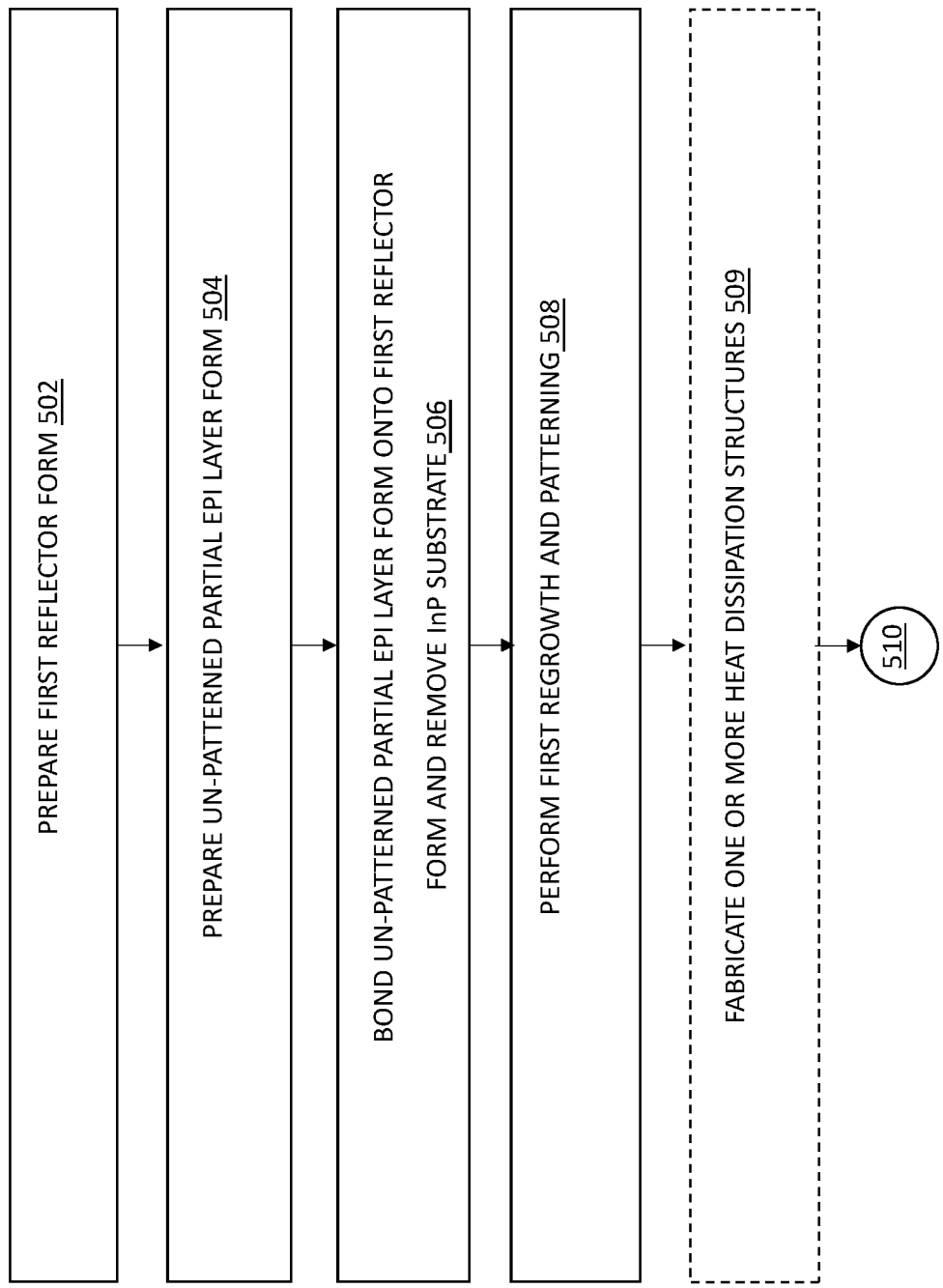
FIG. 5 is a flow chart of fabrication steps for fabricating a VCSEL having a cascaded active region structure, according to an example embodiment.

At fabrication step 512 of FIG. 5, a second reflector form is prepared and bonded onto the regrown bonded blank. The second reflector form comprises a second GaAs substrate/wafer and a second reflector layer. The second reflector layer (e.g., DBR and/or reflector stacks) is formed on the second GaAs substrate/wafer. In an example embodiment, the second reflector form comprises a second GaAs substrate/wafer (e.g., comprising and/or made of GaAs), a buffer layer (e.g., a GaAs buffer approximately 100 nm thick, and/or the like), an etch stop layer (e.g., a $Al_xGa_{(1-x)}As$ as etch stop layer), and alternating high and low refractive index layers that form the second reflector 150. For example, the second reflector 150 may comprise 10-50 alternating high and low refractive index layers. For example, the high refractive index layers may comprise GaAs and the low refractive index layers may comprise $Al_xGa_{(1-x)}As$.

The second reflector 150 may then be bonded onto the regrown bonded blank. In an example embodiment, a bonding interface between the second reflector 150 and an inner surface of the heat dissipation structure 190A is conductive. In an example embodiment, a bonding surface between the second reflector 150 and an outer surface of the heat dissipation structure 190A is non-conductive. For example, a bonding interface between the second reflector 150 and an inner surface (i.e., spanning a plane parallel to the emission axis) of the heat dissipation structure 190A may be configured to conduct heat and/or electricity. As both the second reflector 150 and the regrown bonded blank are based on GaAs substrates/wafers, the bonding of the second reflector 150 onto the regrown bonded blank does not result in differential shrinkage between patterned layers. In other words, the bonding of the second reflector 150 onto the regrown bonded blank does not result in alignment issues. Once the second reflector 150 has been bonded onto the regrown bonded blank, the second GaAs substrate/wafer may be removed. For example, an etching process may be used to remove the second GaAs substrate/wafer (e.g., taking advantage of the etch stop layer of the second reflector form).

At fabrication step 514, mesa patterning and metal contacts and/or contact pad patterning may be performed. For example, the mesa patterning may comprise etching a mesa structure about a location where a tunnel junction 145 is known to be located. In an example embodiment, one or more metal contacts and/or contact pads may be deposited and/or patterned on VCSEL blanks. For example, the contacts and/or contact pads may be configured for wire bonding and/or otherwise placing various components of the VCSEL 100 into electrical communication with one or more control signals and/or ground. In an example embodiment, a dicing procedure may be used to separate the plurality of VCSELs 100 formed on the large wafer. In an example embodiment, one or more of the VCSELs 100 may be tested before the dicing procedure is performed. In various embodiments, the VCSEL 100 may be formed as part of a VCSEL array 200 formed on large wafer and/or on a portion of the larger wafer. Various other finishing steps may be performed to finish the VCSEL 100 and/or the VSEL array 200 and/or to incorporate the VCSEL 100 and/or the VCSEL array 200 into a transmitter and/or transceiver device and/or the like.

As should be understood, once a VCSEL 100 and/or VCSEL array 200 has been formed, manufactured, and/or the like, the VCSEL 100 and/or VCSEL array 200 may be secured, affixed, or otherwise mounted to a circuit board. For example, a VCSEL 100 may be secured, affixed, and/or mounted to a circuit board such that the first contact is mechanically secured to a first lead such that the first contact is in electrical communication with the first lead. The VCSEL 100 may further be secured, affixed, and/or mounted to a circuit board such that the second contact 180 is mechanically secured to a second lead such that the second contact 180 is in electrical communication with the second lead. Mounting a VCSEL 100 and/or VCSEL array 200 to a circuit board may therefore manufacture, generate, form, and/or the like a board-mounted VCSEL 100 and/or VCSEL array 200, respectively.

2. Fabrication of Second Heat Dissipation Structure

In various embodiments, with reference to FIGS. 3A, 3B, and 5, a second heat dissipation structure 190B is used to dissipate heat from the cascaded active region layer structure 120 of the VCSEL 100. In an example embodiment for fabricating a VCSEL 100 and/or VCSEL array 200 comprising a second heat dissipation structure 190B, rather than etching a trench 181 after growing of the cascaded active region layers, the trench 181 is etched after the second reflector is bonded to the cascaded active region layer structure 120. For example, the step of fabricating the heat dissipation structure (e.g., etching the trench 181, depositing oxide and/or dielectric 192, depositing and, possibly, patterning the second heat dissipation structure 190B) as part of step 514. For example, after bonding of the second reflector 150 to the VCSEL 100, as shown in the embodiment depicted in FIG. 3A, a heat dissipation trench 181 may be etched (e.g., using dry etching) that extends through the second reflector layer, the second current spreading layer, the cascaded active region structure layers, the first current spreading layer, and the first reflector layer. In an example embodiment, the heat dissipation trench extends part way into the substrate 110. In an example embodiment, dry etching is allowed to proceed to a pre-determined depth within the first reflector 130. In another example embodiment, dry etching is allowed to proceed to a pre-determined depth within the substrate 110.

In an example embodiment, dry etching of the epitaxially grown layers defines a trench therein, within which the heat dissipation structure 190B may be formed following bonding of the second reflector 150. In an example embodiment, the trench defines lateral surfaces and a bottom surface (e.g., either the first reflector 130 or the substrate 110, at which etching is stopped) that are exposed by the dry etching. In an example embodiment, the lateral surfaces and the bottom surface are oxidized or otherwise covered with an oxide, such as $SiO_2$, or another suitable oxide or dielectric. For example, an oxide layer may be deposited on the exposed surfaces (e.g., including the lateral surfaces and the bottom surface of the trench) and then an etching process may be used to provide an oxide layer that is disposed on the lateral surfaces and the bottom surface of the heat dissipation trench. In an example embodiment, a metal film or layer is deposited in the now oxidized trench such that, during operation of the VCSEL 100, the metal film may act to absorb and dissipate heat away from the cascaded active region layer 120. In an example embodiment, the metal film or layer may be deposited concurrently with the depositing of the contacts 180. The deposited metal film or layer may then be patterned such that heat dissipation structure 190B is formed lining the oxidized lateral and bottom surfaces of the heat dissipation trench.

As shown in the top view of FIG. 3B, the mesa structure 115 is centrally disposed on the wafer 110 between two adjacent heat dissipation trenches. A first heat dissipation trench is shown in an upper left quadrant of the wafer 110. A second heat dissipation trench is shown in a lower right quadrant of the wafer 110. Thus, the view depicted in FIG. 3A may be seen as taken along the dashed diagonal line in FIG. 3B.

CONCLUSION

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

That which is claimed:

1. A vertical-cavity surface-emitting laser (VCSEL) comprising:
    a mesa structure defining an emission axis of the VCSEL, the mesa structure comprising:
        a first reflector,
        a second reflector, and
        a cascaded active region structure disposed between the first reflector and the second reflector, wherein the cascaded active region structure comprises a plurality of cascaded active region layers disposed along the emission axis, wherein each of the cascaded active region layers comprises an active region, a tunnel junction aligned with the emission axis, and an oxide confinement layer on an opposite side of the tunnel junction along the emission axis with respect to the active region; and
    a heat dissipation structure extending between the first reflector and the second reflector.

2. The VCSEL of claim 1, wherein the heat dissipation structure comprises at least one of an oxide surface and a dielectric surface.

3. The VCSEL of claim 2, wherein the at least one of the oxide surface and the dielectric surface contacts a lateral trench surface in the cascaded active region structure and a bottom trench surface in the cascaded active region structure.

4. The VCSEL of claim 2, wherein the heat dissipation structure comprises a metal film in contact with the at least one of the oxide surface and the dielectric surface.

5. The VCSEL of claim 1, wherein each of the plurality of cascaded active region layers is connected in sequence with another of the plurality of cascaded active region layers.

6. The VCSEL of claim 1, further comprising a substrate on which the mesa structure is disposed, wherein the heat dissipation structure extends through the first reflector and between the substrate and the second reflector.

7. The VCSEL of claim 1, further comprising:
    a first current spreading layer disposed between the first reflector and the cascaded active region structure; and
    a first contact in electrical communication with the first current spreading layer.

8. The VCSEL of claim 7, further comprising:
    a second current spreading layer disposed between the cascaded active region structure and the second reflector; and
    a second contact in electrical communication with the second current spreading layer.

9. The VCSEL of claim 8, wherein the first current spreading layer and the second current spreading layer are configured to provide electrical signals applied to the first contact and the second contact, respectively, to each active region of the cascaded active region structure.

10. A vertical-cavity surface-emitting laser (VCSEL) comprising:
    a substrate;
    a mesa structure disposed on the substrate, the mesa structure defining an emission axis of the VCSEL, the mesa structure comprising:
        a first reflector,
        a second reflector, and
        a cascaded active region structure disposed between the first reflector and the second reflector, wherein the cascaded active region structure comprises a plurality of cascaded active region layers disposed along the emission axis, wherein each of the cascaded active region layers comprises an active region, a tunnel junction aligned with the emission axis, and an oxide confinement layer on an opposite side of the tunnel junction along the emission axis with respect to the active region; and
    a heat dissipation structure extending between the substrate and the second reflector.

11. The VCSEL of claim 10, wherein the heat dissipation structure extends into the substrate.

12. The VCSEL of claim 10, wherein the heat dissipation structure comprises at least one of an oxide surface and a dielectric surface.

13. The VCSEL of claim 12, wherein the at least one of the oxide surface and the dielectric surface contacts a lateral trench surface in the cascaded active region structure and a bottom trench surface in the cascaded active region structure.

14. The VCSEL of claim 12, wherein the at least one of the oxide surface and the dielectric surface contacts a lateral trench surface in the first reflector and a bottom trench surface in the first reflector.

15. The VCSEL of claim 12, wherein the at least one of the oxide surface and the dielectric surface contacts a lateral trench surface in the second reflector.

16. The VCSEL of claim 12, wherein the heat dissipation structure comprises a metal film in contact with the at least one of the oxide surface and the dielectric surface.

17. A vertical-cavity surface-emitting laser (VCSEL) comprising:
    a substrate;
    a mesa structure disposed on the substrate, the mesa structure defining an emission axis of the VCSEL, the mesa structure comprising:
        a first reflector,
        a second reflector, and
        a cascaded active region structure disposed between the first reflector and the second reflector, wherein the cascaded active region structure comprises a plurality of cascaded active region layers disposed along the emission axis, wherein each of the cascaded active region layers comprises an active region, a tunnel junction aligned with the emission axis, and an oxide confinement layer on an opposite side of the tunnel junction along the emission axis with respect to the active region;

a first heat dissipation structure extending between the first reflector and the second reflector; and a second heat dissipation structure extending between the substrate and the second reflector.

18. The VCSEL of claim 17, wherein:

the first heat dissipation structure comprises at least one of a first oxide surface and a first dielectric surface in contact with a first lateral trench surface in the cascaded active region structure; and the second heat dissipation structure comprises at least one of a second oxide surface and a second dielectric surface in contact with a second lateral trench surface in the cascaded active region structure.

19. The VCSEL of claim 18, wherein:

the first heat dissipation structure comprises a first metal film in contact with the at least one of the first oxide surface and the first dielectric surface; and the second heat dissipation structure comprises a second metal film in contact with the at least one of the second oxide surface and the second dielectric surface.

20. The VCSEL of claim 17, wherein the second heat dissipation structure is substantially u-shaped and comprises a planar base and two vertical legs.

* * * * *